(12) United States Patent
Yang et al.

(10) Patent No.: US 7,761,819 B2
(45) Date of Patent: Jul. 20, 2010

(54) SYSTEM AND METHOD OF MODIFICATION OF INTEGRATED CIRCUIT MASK LAYOUT

(76) Inventors: Yue Yang, 8153 Park Villa Cir., Cupertino, CA (US) 95014; Marko P. Chew, 3270 South Ct., Palo Alto, CA (US) 94306

( * ) Notice: Subject to any disclaimer, the term of this patent is extended or adjusted under 35 U.S.C. 154(b) by 434 days.

(21) Appl. No.: 11/824,749

(22) Filed: Jul. 2, 2007

(65) Prior Publication Data

US 2008/0010619 A1    Jan. 10, 2008

Related U.S. Application Data

(60) Provisional application No. 60/818,782, filed on Jul. 5, 2006.

(51) Int. Cl.
*G06F 17/50* (2006.01)
(52) U.S. Cl. .............. 716/2; 716/8; 716/9; 716/10; 716/19
(58) Field of Classification Search ............... 716/2, 716/3, 5, 8–11, 19
See application file for complete search history.

(56) References Cited

U.S. PATENT DOCUMENTS

| | | | | |
|---|---|---|---|---|
| 5,535,134 A | * | 7/1996 | Cohn et al. | 716/8 |
| 5,610,831 A | * | 3/1997 | Matsumoto | 716/19 |
| 5,745,374 A | * | 4/1998 | Matsumoto | 716/9 |
| 6,391,501 B1 | * | 5/2002 | Ohnuma | 430/22 |
| 7,475,382 B2 | * | 1/2009 | Melvin et al. | 716/21 |
| 7,610,565 B2 | * | 10/2009 | Allen et al. | 716/2 |
| 2006/0101357 A1 | * | 5/2006 | Allen et al. | 716/3 |

* cited by examiner

*Primary Examiner*—Sun J Lin

(57) ABSTRACT

Integrated circuit mask layouts are modified for the purpose of migration to abide a new set of design rules, or for the purpose of optimization for timing, power, signal integrity and manufacturability, among other purposes. The modified layout is required to satisfy a set of constraints generated from design rules, electrical specifications, user specifications among other requirements. The present invention provides a system and a method of representing constraint sets, each of which consists of two or more sets of constraints that are mutually exclusive to each other. In the preferred embodiment, one method of formulation is presented, and a method of solving the layout modification problem under the constraint sets is presented.

12 Claims, 8 Drawing Sheets

SYSTEM AND METHOD OF MODIFICATION OF INTEGRATED CIRCUIT MASK LAYOUT

CLAIM OF BENEFIT TO PROVISIONAL APPLICATION

This patent application claims the benefit of the earlier-filed U.S. Provisional Patent Application entitled "System and method of modification of integrated circuit mask layout", having Ser. No. 60/818,782, and filed Jul. 5, 2006.

TECHNICAL FIELD OF APPLICATION

This invention relates generally to the design and manufacture of integrated circuitry and more particularly to a method and a system of modifying integrated circuit layout.

BACKGROUND OF THE INVENTION

It is desirable to modify an integrated circuit layout under certain circumstances. One such circumstance is process migration, in which an integrated circuit_layout developed for one process technology is modified to abide a new set of design rules required by another process technology, normally from another foundry or another process node. Another example is layout optimization, in which an integrated circuit_layout is modified to improve the integrated circuit on certain metrics, such as timing, power consumption, signal integrity or manufacturability. The process of integrated circuit layout modification is performed either manually by layout designers using layout editing tools such as Cadence Virtuoso; or by a design automation computer program run on a computer system.

The integrated circuit layout modification is performed either in two-dimensional manner, in which both horizontal and vertical orientations are modified simultaneously; or by alternating between horizontal and vertical orientations, modifying layout in one orientation while keeping integrated circuit layout unchanged in the other orientation. Two-dimensional approach is considered superior for a plurality of reasons. Among others, first, some spatial constraints between layout shapes are intrinsically two-dimensional, such as, but not limited to, constraints between two geometric corners. Handling constraints of these types in one orientation at a time inevitably forces decisions to be made on the other orientation in advance, which may cause sub-optimal results or infeasibilities. Infeasibilities happen when there is no feasible solution that satisfies all constraints simultaneously. Second, modern process technologies are very complex, the design rules provided by foundries usually contain a plurality of conditional rules, most of which are two-dimensional. One example is width-dependent spacing rule, where the spacing between two shapes in one orientation depends on the overlapping length of the projections of these two shapes in another orientation. Handling constraints of these types in one orientation at a time inevitably forces decisions to be made on the other orientation in advance, which may cause sub-optimal results. Third, the quality of results of layout modification performed in one orientation at a time depends on which orientation to start with, therefore the results may not be optimal.

One existing approach of performing automated integrated circuit_layout modification is based on integrated circuit_layout compaction. Using this approach, the existing layout is examined to generate a collection of sets of edges. The edges in each set are relevant to each other. Then spatial constraints are generated between each set of edges from design rules and other specifications. By allocating variables for locations of edges and points, the constraints are translated to a collection of inequalities and equations that form the constraints of a Linear Programming ("LP") problem. The objective function of the LP is constructed to reflect the desirable qualities of an integrated circuit. For example, smaller die size is desirable to achieve lower cost and higher running clock frequency of an integrated circuit. In turn achieving smaller die size is translated to minimization of layout area. After an optimal or close to optimal solution of the LP is found, the existing integrated circuit layout is modified according to the solution. If the design structure of an integrated circuit layout is flat, and the formulation of constraints is such that each spatial constraint constructed between two edges contains two linear terms each containing the two variables representing the position of the two edges, the layout modification problem may be represented by a constraint graph model, which may be solved more efficiently.

Another approach of performing automated layout modification is based on minimum perturbation of an integrated circuit layout. It enforces design rules and other specifications while maintaining similarity to an existing integrated circuit layout. An LP is formulated using constraints generated from design rules and other specifications. The objective function of the LP is constructed to measure location perturbation and separation perturbation of objects in layouts. The solving of the LP minimizes the perturbation to both location and separation while enforcing constraints.

Some prior art formulate the optimization problem by including all the active constraints. In the case when mutually exclusive spatial constraints or groups of spatial constraints exist, decision has to be made in advance which spatial constraints or which groups of spatial constraints should be active, while the other spatial constraints or groups of spatial constraints should be deactivated. The decision of activating which spatial constraints or groups of spatial constraints depends mostly on the original layout. This practice limits the flexibility and capability for integrated circuit layout modification process to obtain optimal or close to optimal solution.

Some prior art deal with conditional spatial constraints or two-dimensional spatial constraints by using a branch and bound approach. By pruning the decision tree branches that generate worse results then that already recorded, it is possible to achieve close to optimal compaction result. However, the approaches were presented in the cases that can be modeled by constraint graphs, and where the solution search space is always feasible. When constraints of equality types are presented, for example, when device size is fixed, or when one dimension of the design is of fixed value, the order of variables handled by the branch and bound algorithm may have huge impact on integrated circuit layout modification run time to make the approaches practically not useable.

SUMMARY OF THE INVENTION

The present invention provides a system and a method to formulate integrated circuit layout modification problem involving conditional spatial constraints and two-dimensional spatial constraints, and a system and a method of solving the integrated circuit layout modification problem efficiently are also described.

These and other objects, features and advantages in accordance with the present invention are provided by a system and a method of modification of an existing integrated circuit layout.

DETAILED DESCRIPTION OF THE PREFERRED EMBODIMENTS

This invention relates to an integrated circuit layout modification system and an integrated circuit layout modification method, and more to a methodology for generating constraint sets and solving of these constraint sets generated from complex design rules and design requirements. The present invention describes a system and a method of representing mutually exclusive collections of spatial constraints or groups of spatial constraints, each of which consists of two or more sets of spatial constraints that are mutually exclusive. This includes, but not limited to, the cases of conditional spatial constraints and two-dimensional spatial constraints. In the preferred embodiment, a system and a method of formulation and a system and a method of solving the integrated circuit layout modification problem efficiently under the presented formulation are presented.

In the following description, numerous details are set forth for purpose of explanation. However, one of skill in the art will realize that the invention may be practiced with the variations of these specific details. In other instances, well-known structures or operations are not shown in detail to avoid obscuring the invention.

Figure 1:
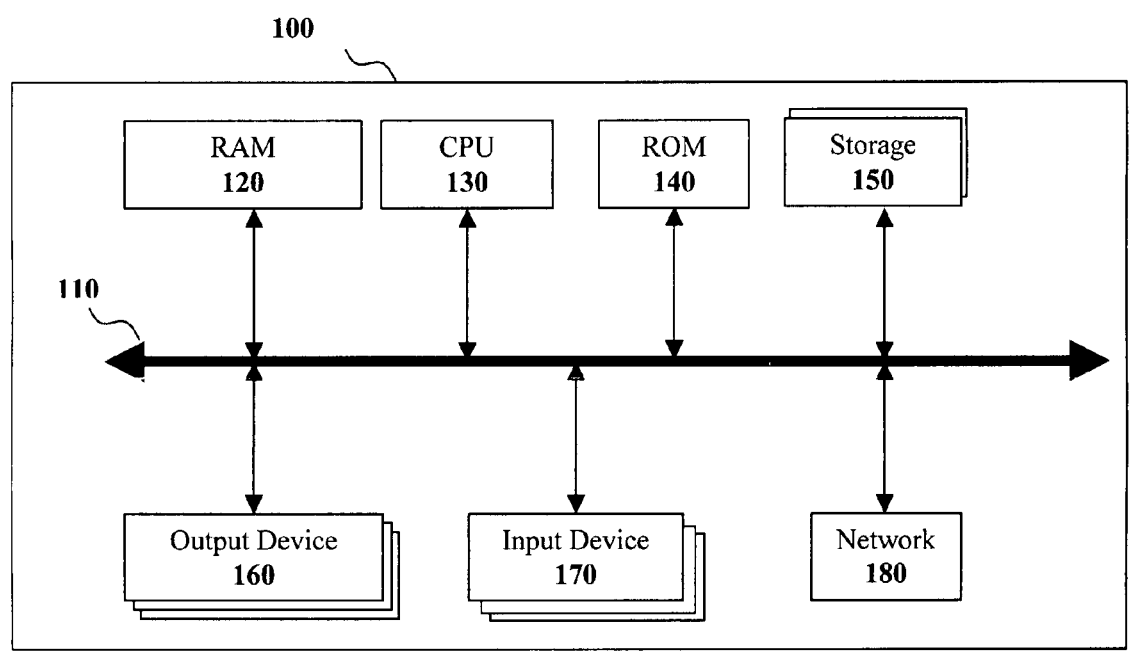
FIG. 1 illustrates a computing environment used in some embodiments of the present invention.

FIG. 1 illustrates a block diagram of the computing environment that one embodiment of the present invention is implemented. Even though the computer system is described with specific components and architecture for illustration, it should be understood that the present invention might be implemented in several other types of embodiments. For example, the invention can be implemented on single computer with a processor chip containing 2 or more processor cores with each core containing additional hardware to maintain state of two or more threads of execution. In addition, each component can be implemented as a combination of one or more of hardware, software and firmware, even though many features of the present invention are described herein as being implemented in software.

The computing environment 100 may contain one or more components such as a communication fabric 110, random access memory (RAM) 120, central processing unit (CPU) 130, read only memory 140 (ROM), secondary memory (Storage) 150, output devices 160, input Devices 170, network interface 180. All the components may communicate with each other over communication fabric 110. The communication fabric 110 collectively represents all systems, peripherals, chipset buses and all other communication pathways that can connect the components of the computing environment 100. The components of FIG. 1 are described below in further detail.

CPU 130 retrieves the instructions and data to process in order to execute the processes of this invention from the various storage components of computing environment 100. The ROM 140 stores the static instruction and data not modified during normal operation and are needed by CPU 130 and any other component of the computing environment 100. Read-write memory (RAM) 120 is a volatile storage that requires power to be supplied to store the instructions and data. Storage 150 is nonvolatile storage that doesn't need power to store instructions and data. In some embodiments, storage 150 use fixed mass-storage devices such as disk drives. Other embodiments use removal mass-storage devices such as removable disk drives. The RAM 120 stores some of the instructions and data that the CPU 130 needs. In some embodiments, the invention's processes are stored in the CPU 130, RAM 120, ROM 140, and/or storage 150.

The input device 170 enables the user to issue commands to the computing environment. Examples of an input device 170 include but are not limited to, keyboards, mouse, and/or tablet and stylus. The output device 160 is used to display images generate by the computing environment such as but not limited to modified integrated circuit layout.

Network interface 180 may be implemented using protocols such as TCP/IP, ATM and/or Ethernet. In this manner, the computer can be a part of a network of computers (such as a local area network ("LAN"), a wide area network ("WAN"), or an Intranet) or a network of networks (such as the Internet). Any, some or all of the components of computing environment 100 may be used in conjunction with the invention. However, one of ordinary skill in the art would appreciate that any other system configuration may also be used in conjunction with the present invention.

As noted above, CPU 130 may retrieve the software instructions, and execute the instructions to provide various features of the present invention. The features of the present invention are described below in further detail.

Figure 2:
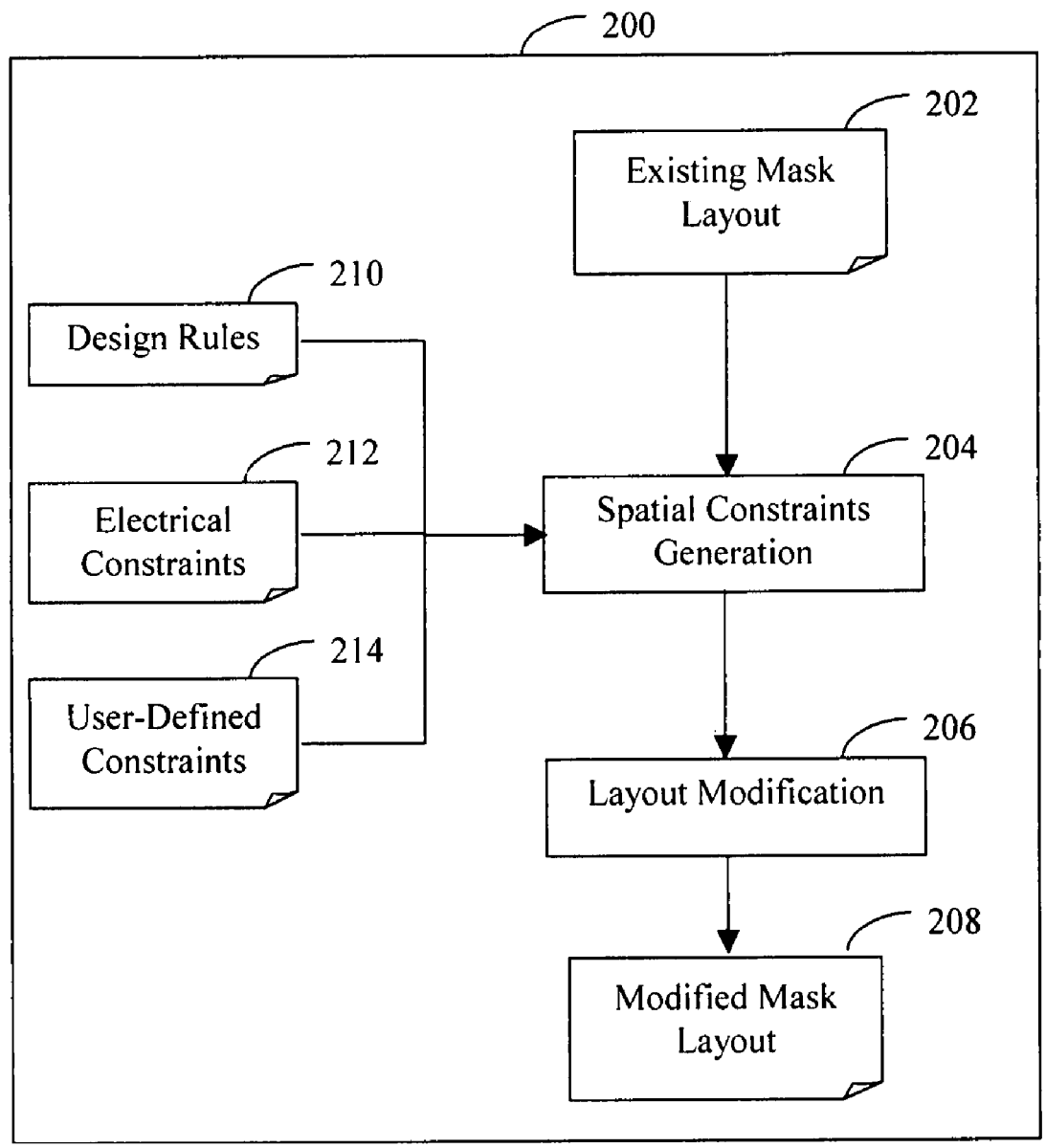
FIG. 2 illustrates a flow of automated modification of integrated circuit layout.

FIG. 2 illustrates the process 200 used by some embodiments of the current invention to automate modification of an integrated circuit layout.

The existing layout 202 is examined so that a plurality of spatial constraints is generated in 204. A spatial constraint reflects required relationship between a set of edges such as, but not limited to, a pair of edges or a set of edges; or reflects a required position of an edge or a point. The spatial constraints are generated according to design rules 210, electrical specifications 212, or user specifications 214, among other requirements. The constraints are generated between edges that are identified as relevant to each other according to the design rules, electrical specifications or user specifications, among other requirements. For example, generation of minimum spacing constraints between two edges that are invisible to each other due to blockage of other shapes in layout needs not to be considered.

Variables are allocated to represent positions of edges of shapes that are to be modified. Therefore spatial constraints are represented in the form of inequalities and equations containing the variables representing coordinates of edges of shapes in layout. These constraints are either linear or may be relaxed into linear constraints. They form the constraints of an LP problem. The objective function of the LP is a weighted combination of desirable qualities of an integrated circuit, including, but not limited to, die size, electrical specifications, and user specifications, among other requirements. For example, minimization of manufacturing cost may be translated to minimization of die area. The construction of the objective function reflects users' priorities. The objective function contains a subset of same variables as in the constraints.

The LP is then solved by a solver in 206. If a optimal or close to optimal feasible solution is found, the variables representing coordinates of integrated circuit layout shapes are updated, and therefore the integrated circuit layout is modified according to the updated values of these variables. The modified integrated circuit layout is saved to a data repository on one or more processor readable storage devices.

Figure 3:
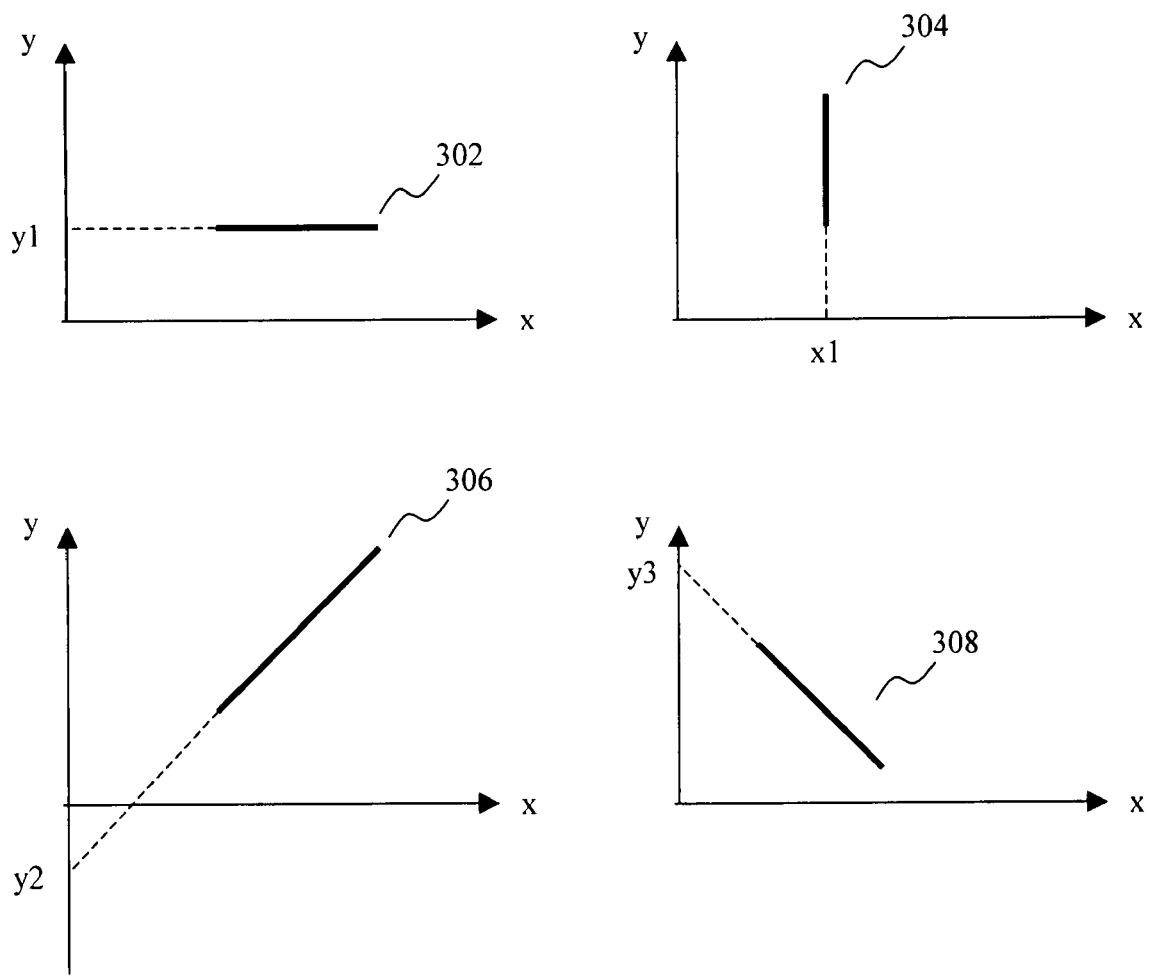
FIG. 3 illustrates an exemplary implementation of representing the location of an edge with variables.

FIG. 3 illustrates an exemplary implementation of canonically representing the position of an edge with variables. It is recognized that in an integrated circuit layout, the angles of all edges are multiples of 45 degrees. Each edge is represented by an angle, and a position variable. In cases when the edge is horizontal as edge 302, the angle is 0 or 180 degrees depending on the selection of the starting end point, the position variable is the intersection of the edge or its extension and Y-axis; in cases when the edge is vertical as edge 304, the angle is 90 or 270 degrees depending on the selection of the starting end point, the position variable is the intersection of the edge or its extension and X-axis; in cases when the angle is 45 or 225 degrees as edge 306 depending on the selection of the starting end point, the position variable is the intersection of the edge or its extension and Y-axis; in cases when the angle is 135 or 315 degrees as edge 308 depending on the selection of the starting end point, the position variable is the intersection of the edge or its extension and Y-axis. A corner in a layout is recognized as an artificial product of the two edges that intersects at the corner. It is represented by the variables defining the two edges. The formulation depends on the orientation of the two edges. A shape in a integrated circuit layout database is represented by the position of the vertices defining the shapes.

Figure 4:
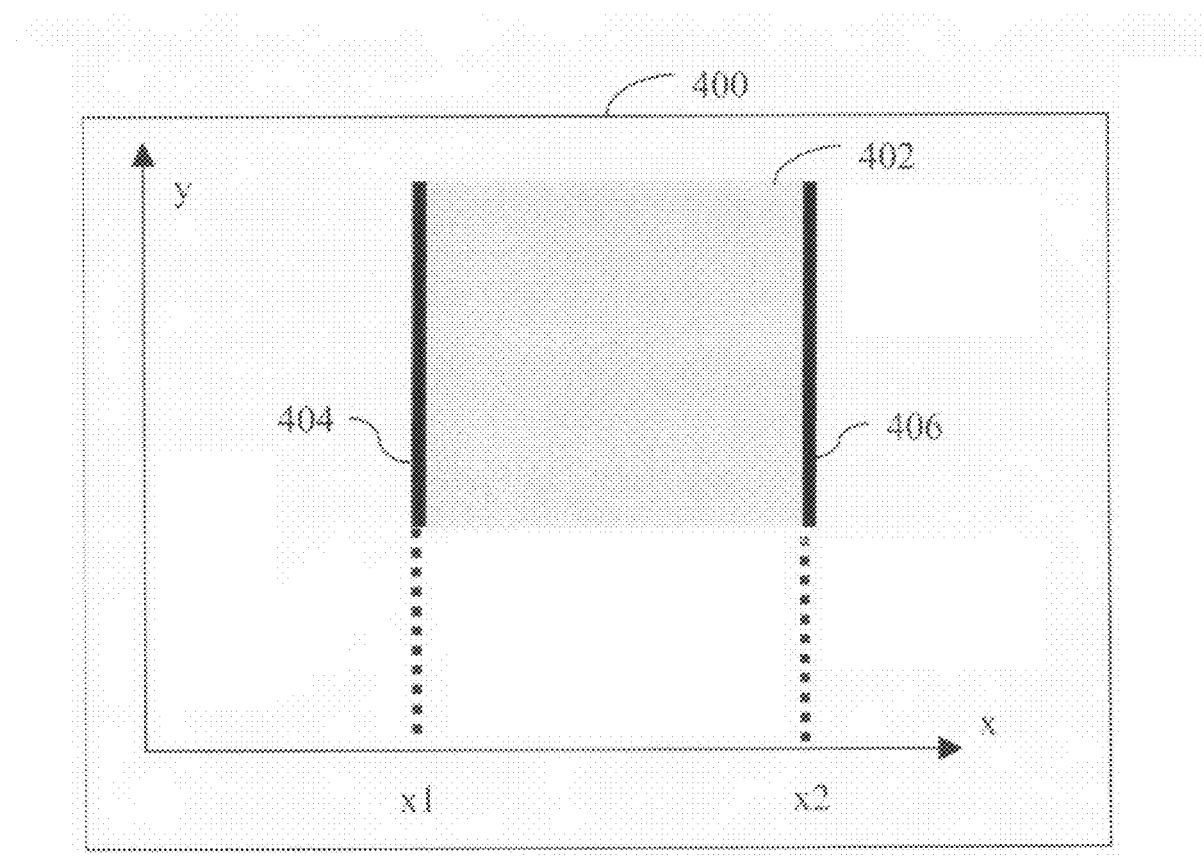
FIG. 4 illustrates an example of spatial constraints generated from design rules.
Figure 5A:
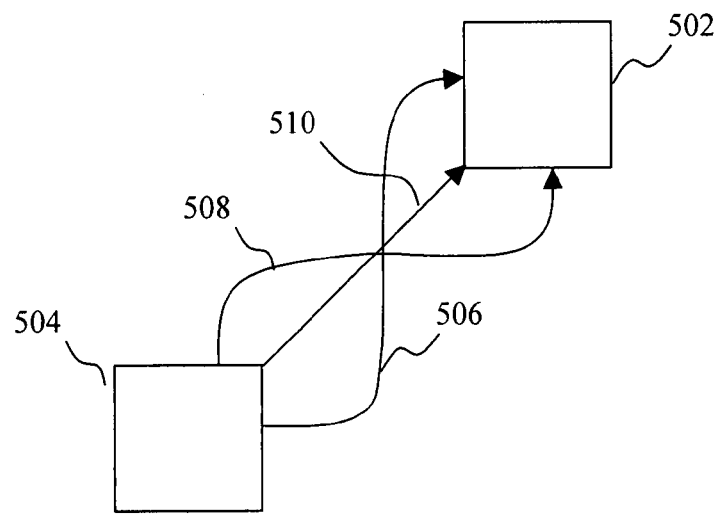
FIG. 5(a)-(d) illustrate an example of corner-to-corner spatial constraints.
Figure 5B:
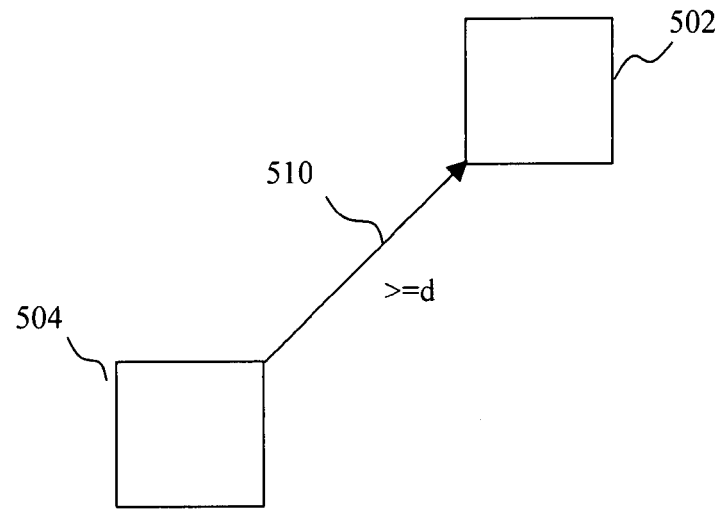
Figure 5C:
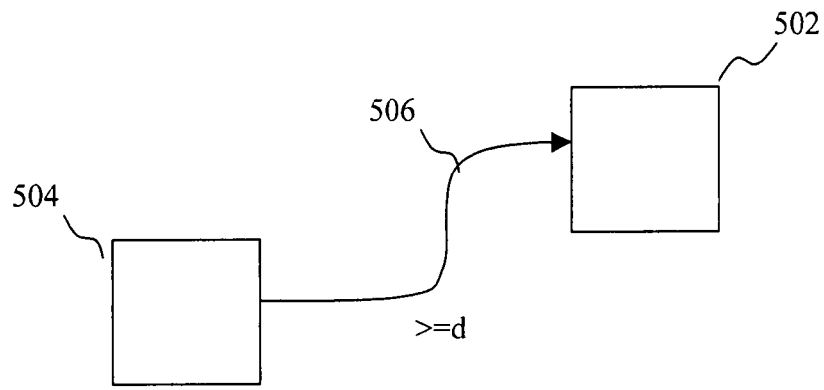
Figure 5D:
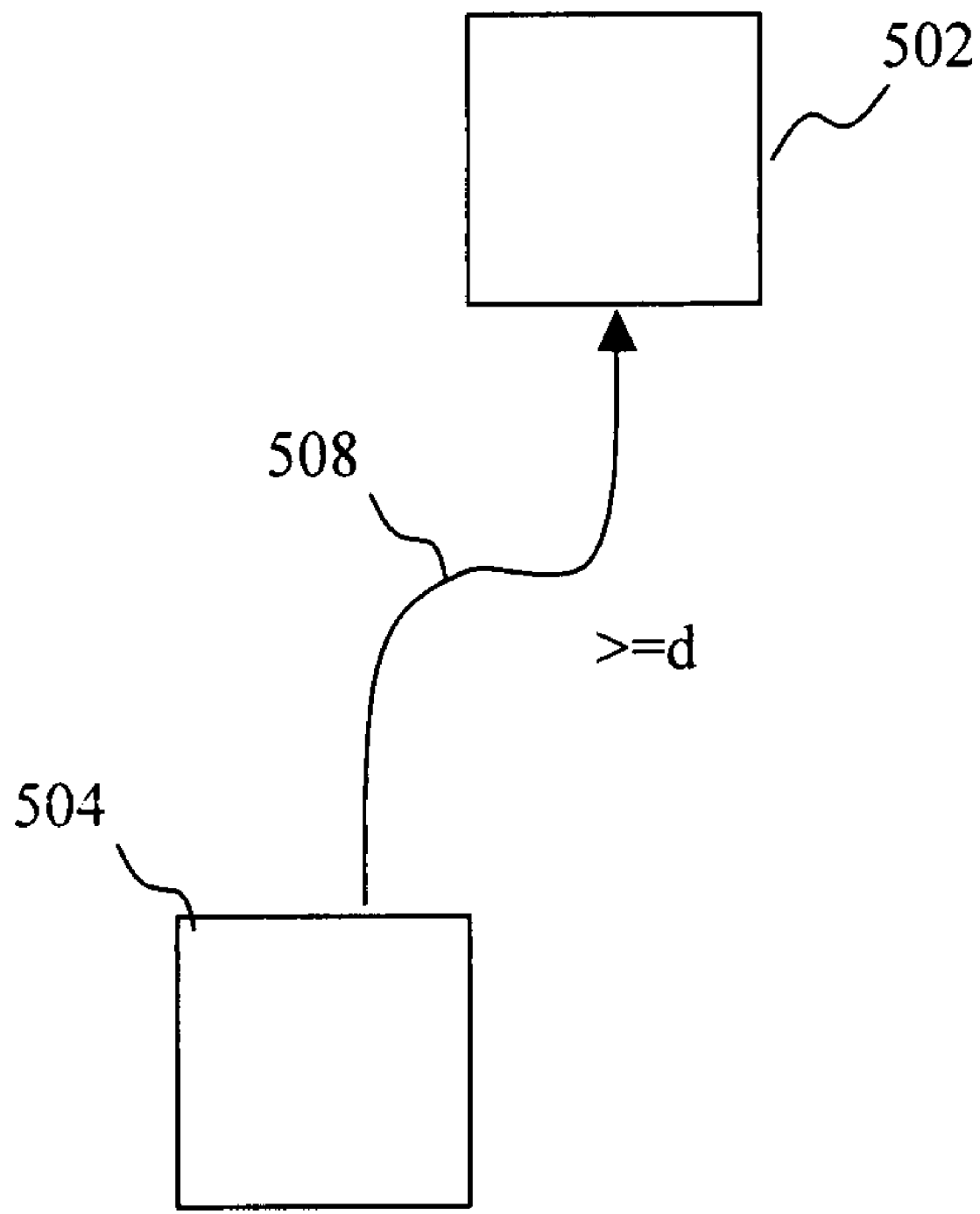

The spatial constraints between two edges, points or shapes are therefore converted to inequalities and equations containing the variables representing these geometrical entities. FIG. 4 illustrates an example 400 of spatial constraints generated from design rules. Design rules require the minimum width of a shape 402 on METAL1 layer to be d. The distance between edge 404 and edge 406 should be greater than or equal to d. The position of vertical edge 404 is represented by the x-coordinate of all the points on this edge, variable x1. In the same manner, the position of vertical edge 406 is represented by variable x2. During the integrated circuit layout modification process, the edges 404 and 406 maintain the same orientation, and the same relative position. The spatial constraint reflecting that requirement direction is $$x2-x1 \geq d \quad (1)$$

It is recognized that there are spatial constraints or groups of spatial constraints generated from a integrated circuit layout based on design rules and other specifications are mutually exclusive. The definition of "mutually exclusive" refers to the inclusion of certain constraints into the LP to be solved. Being "mutually exclusive" does not necessarily mean that when one constraint or group of constraint is satisfied, the others are violated; it means that only one constraint of group of constraint needs to be satisfied and therefore is active in the LP, while the others are deactivated in the LP.

FIG. 5(*a*)-(*d*) illustrate an example of corner-to-corner spatial constraints as an example of mutually exclusive spatial constraints. In FIG. 5(*a*), the two facing corners of shapes 502 and 504 should be spaced apart by a minimum distance d, according to a design rule. One of three possible spatial constraints 506, 508 and 510 needs to be enforced. In FIG. 5(*b*), constraint 310 is enforced, the relative placement of the two facing corners of 502 and 504 is maintained, i.e., the corner of 502 is kept to be right to and above the corner of 504, and the distance between these corners needs to be at least d. In FIG. 5(*c*), constraint 506 is enforced, shape 502 is allowed to slide down, but the distance between the two facing edges of 502 and 504 needs to be at least d. In FIG. 5(*d*), constraint 508 is enforced, shape 502 is allowed to slide to the left, but the distance between the two facing edges of 502 and 504 needs to be at least d.

Figure 6A:
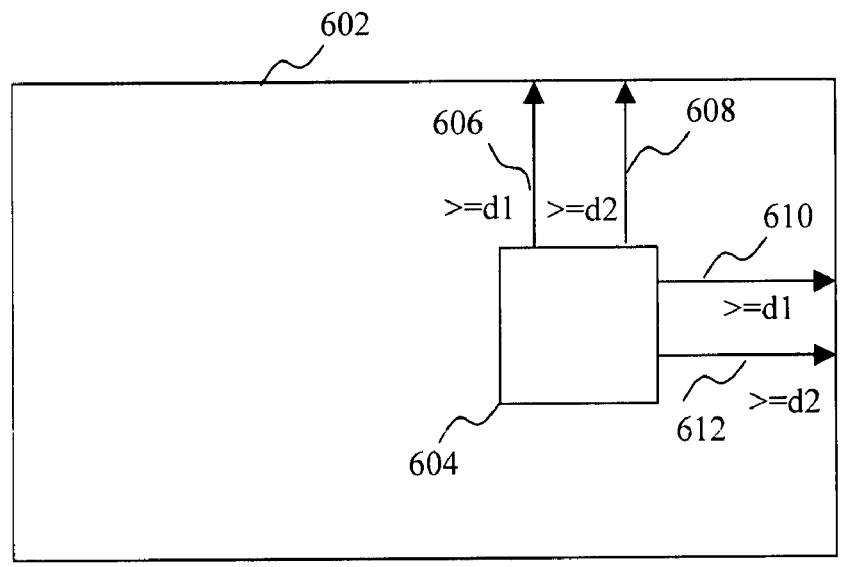
FIG. 6(a)-(c) illustrate an example of end-of-line enclosure spatial constraints.
Figure 6B:
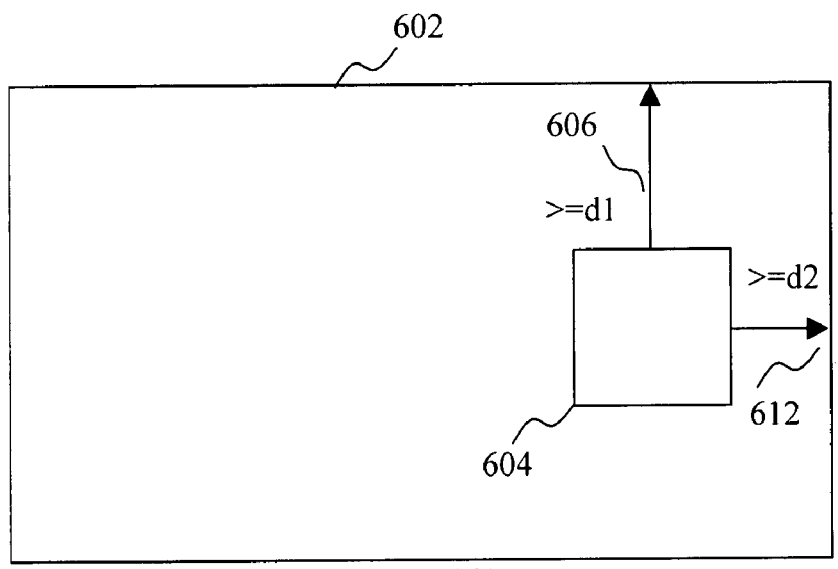
Figure 6C:
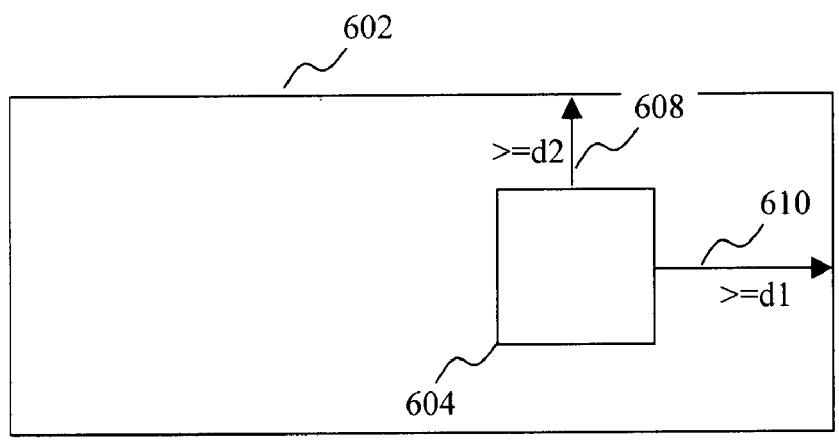

FIG. 6(*a*)-(*c*) illustrate an example of end-of-line contact/ via enclosure spatial constraints as another example of mutually exclusive groups of spatial constraints. The enclosure of shape 602 over 604 is at least d1 in one orientation and d2 in another orientation. Therefore, either 606 and 612 are active, or 608 and 610 are active. Without loss of generality, assume d1>d2. In FIG. 6(*b*), constraints 606 and 612 are enforced. In FIG. 6(*c*), constraints 608 and 610 are enforced.

Figure 7:
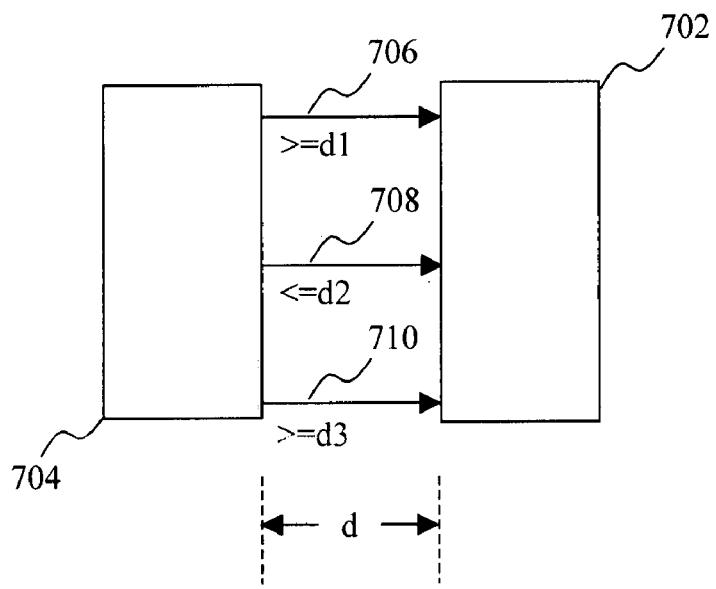
FIG. 7 illustrates an example of forbidden zone spacing spatial constraints.

FIG. 7 illustrates an example of forbidden zone spacing spatial constraints as an example of mutually exclusive spatial constraints. The design governing the spacing between shape 702 and 704 has a minimum value of d2 and a "forbidden zone" between d3 and d1, assuming d2<d3<d1, i.e. the spacing d between 702 and 704 must satisfy either $$d \geq d2 \text{ and } d \leq d3 \quad (2)$$

or $$d \geq d1 \quad (3)$$

Therefore either constraint 706 is enforced or the group of constraints including constraints 708 and 710 is enforced.

The efficient and flexible handling of the mutually exclusive spatial constraints or groups of spatial constraints is desirable in obtaining high quality of integrated circuit layout modification. The present invention uses an integer to formulate the mutual exclusiveness of spatial constraints or groups of spatial constraints. For example, in the case of constraints e1 and e2 are mutually exclusive, an integer variable v is used to represent this relationship:

e1 is active when v=0,
e2 is active when v=1, $$v \in Z, v \geq 0 \text{ and } v \leq 1 \quad (4)$$

Another example is the case of constraints e1, e2 and e3 are mutually exclusive, an integer variable v is used to represent this relationship:

e1 is active when v=0,
e2 is active when v=1,
e3 is active when v=2, $$v \in Z, v \geq 0 \text{ and } v \leq 2 \quad (5)$$

Another example is the case of constraint groups g1 and g2 are mutually exclusive an integer variable v is used to represent this relationship:

all constraints in g1 are active when v=0,
all constraints in g2 are active when v=1, $$v \in Z, v \geq 0 \text{ and } v \leq 1 \quad (6)$$

There is a plurality of ways of incorporating these integer variables into an LP through transformation. An exemplary implementation, which should not be considered limiting to the attached claims, is to convert integer variable into one or more integer variables that may only take value of either 0 or 1 ("0-1 variables"). For example, an integer variable v, where $v \in [0, 2]$ may be represented by two 0-1 variables $v_1$ and $v_2$, where v=0 is equivalent to $v_1$=0 and $v_2$=0, v=1 is equivalent to $v_1$=1 and $v_2$=0, v=2 is equivalent to $v_1$=0 or 1 and $v_2$=1, $$v_1 \in Z, v_1 \geq 0 \text{ and } v_1 \leq 1$$

$$v_2 \in Z, v_2 \geq 0 \text{ and } v_2 \leq 1 \quad (7)$$

To incorporate a 0-1 variable in an LP, it is recognized that all the inequalities and equations may be converted to an inequality of minimum type, such as $$\sum_i a_i x_i \leq b \quad (8)$$

and adding a number whose value is substantially larger than possible values of left hand side of the inequalities to the right hand side in practice deactivates the constraint. For example, in the case of constraints e1 and e2 are mutually exclusive, the constraints are transformed to:

$$e1: \sum_i a_{1i} x_i \leq b_1 \quad (9)$$

$$e2: \sum_i a_{2i} x_i \leq b_2$$

$$\sum_i a_{1i} x_i \leq b_1 + Cv$$

and $$\sum_i a_{2i} x_i \leq b_2 + C(1 - v)$$

$$v \in Z, v \geq 0 \text{ and } v \leq 1$$

C is a large real number

In the case of constraints e1, e2 and e3 are mutually exclusive, the constraints are transformed to:

$$e1: \sum_i a_{1i} x_i \leq b_1 \quad (10)$$

$$e2: \sum_i a_{2i} x_i \leq b_2$$

$$e3: \sum_i a_{3i} x_i \leq b_3$$

$$\sum_i a_{1i} x_i \leq b_1 + Cv_1 + C'v_2$$

and $$\sum_i a_{2i} x_i \leq b_2 + C(1 - v_1) + C'v_2$$

and $$\sum_i a_{3i} x_i \leq b_3 + C'(1 - v_2)$$

-continued $$v_1 \in Z, v_1 \geq 0 \text{ and } v_1 \leq 1$$

$$v_2 \in Z, v_2 \geq 0 \text{ and } v_2 \leq 1$$

C and C' are large real numbers

Therefore, the LP containing spatial constraints or groups of spatial constraints that are mutually exclusive to each other is transformed to a mixed integer programming problem, which contains 0-1 variables reflecting the relationship between the spatial constraints and the groups of spatial constraints, and other variables reflecting the positions of edges, points and other geometrical entities. It is to be recognized that the 0-1 variables in this mixed integer programming problem are usually not directly correlated, they are rather correlated through the constraints they reflect.

Figure 8:
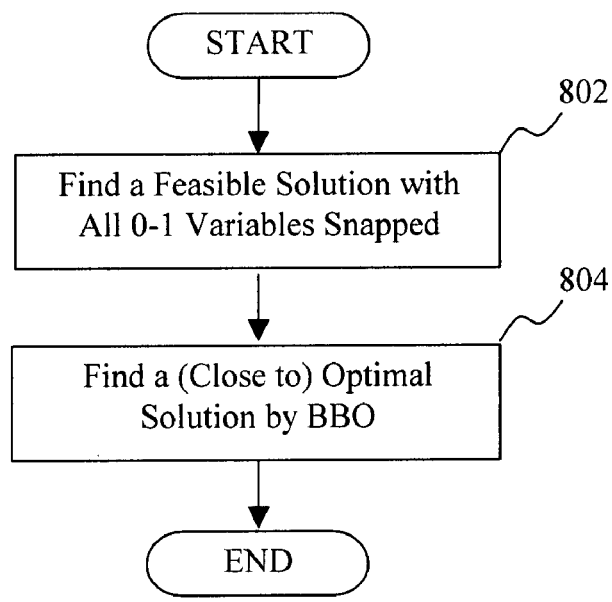
FIG. 8 illustrates an exemplary flow of solving mixed integer programming problem in integrated circuit layout modification.

FIG. 8 illustrates an exemplary flow of solving this type of mixed integer programming problems. In process 802, a feasible solution with all the 0-1 variables described above snapped to value 0 or 1 is found. Then in process 804, an optimal or close to optimal solution is found by exploring the 0-1 variables by using Branch and Bound Optimization (BBO). Process 804 is terminated if an optimal solution is not found, but the limits on run time or other criteria are reached.

There is a plurality of possible approaches of implementing process 802. An exemplary implementation is that: first, solving the LP by treating all 0-1 variables as regular variables in real domain. The result is that the value of the 0-1 variables in the solution may not be integers. The process then tries to snap the 0-1 variables in a random or a prioritized order one by one, by solving the LP with the variable set to 0 and 1 respectively. If both solutions are feasible, the one branch that results lower cost or is preferred is used, and the variable is set to the value corresponding to that branch; if only one branch is feasible, that branch is used; if both branches are infeasible, the process backtracks on that variable. When a variable previously visited are reached during backtracking, and both branches are feasible, the branch that was not chosen may be used. If the process is backtracked on a certain variable more than certain times, the variable is put in front of the variable queue, and the whole process is restarted. This process is guaranteed to find a feasible solution if such a solution exists.

It is recognized that if a 0-1 variable has a non-integer value, all the constraints of groups of constraints it controls are deactivated, such as in formulas (9) and (10). It may cause the initial LP solution too different from a feasible integer solution, and then causes the run time of process 802 longer than necessary. Numerous heuristics are helpful. For example, if there is a constraint that may be formulated as the common denominator of the two constraints, i.e. it is satisfied if either of the constraints is satisfied, it should be included in the LP. Another heuristics is to preset the values of 0-1 variables based on user preferences and initial layout configuration.

In process 804, a branch of decision tree on a variable is pruned if it yields a higher cost than what was already recorded, or it yields an infeasibility, which means the existing constraints may not be satisfied at the same time.

Although the description above contains many specificities, these should be not be construed as limiting the scope of the invention but merely providing illustrations of some of the presently preferred embodiments of this invention.

Thus the scope of the invention should be determined by the appended claims and their equivalents, rather than by the examples given.

We claim:

1. A method, executed by at least one processor of a computer, for modifying an integrated circuit layout, comprising:
   receiving a plurality of geometrical components in the integrated circuit layout;
   allocating a plurality of geometrical variables to represent said geometrical components;
   constructing a plurality of constraints representing required relationships among said geometrical variables;
   constructing a plurality of mutually exclusive constraint groups with each mutually exclusive constraint group consisting of two or more of said constraints of which only one of said constraints can be satisfied while the remaining of said constraints must be unsatisfied;
   allocating a plurality of integer variables that can only take value of either 0 or 1 for each of said constraints in said mutually exclusive constraint groups;
   constructing a mixed integer programming formulation using said geometrical variables, said integer variables, said constraints, and said mutually exclusive constraint groups such that a selection of said satisfied constraint in said each mutually exclusive constraint group is allowed to change;
   solving said mixed integer programming formulation to compute new values for said geometrical variables and said integer variables;
   extracting a modified integrated circuit layout from said new values of said geometrical variables; and
   storing said modified integrated circuit layout in a tangible computer accessible medium.

2. The method as recited in claim 1 further comprising constraints representing required relationships among said geometrical variables representing said geometrical components of the integrated circuit layout and said required relationships derived from design rules, electrical specifications, or user specifications among other requirements.

3. The method as recited in claim 1 further comprising constraints representing required relationships among said geometrical variables representing the geometrical components which are different in orientation.

4. The method as recited in claim 1 further comprising constraints representing required relationships among said geometrical variables representing said geometrical components of the integrated circuit layout with said required relationships have two or more non-overlapping ranges of allowable values.

5. One or more processor readable storage devices, tangibly embodying a program of instructions executable by one or more processors to perform a method for modifying an integrated circuit layout, the method comprising:
   receiving a plurality of geometrical components in the integrated circuit layout;
   allocating a plurality of geometrical variables to represent said geometrical components;
   constructing a plurality of constraints representing required relationships among said geometrical variables;
   constructing a plurality of mutually exclusive constraint groups with each mutually exclusive constraint group consisting of two or more of said constraints of which only one of said constraints can be satisfied while the remaining of said constraints must be unsatisfied;
   allocating a plurality of integer variables that can only take value of either 0 or 1 for each of said constraints in said mutually exclusive constraint groups;
   constructing a mixed integer programming formulation using said geometrical variables, said integer variables, said constraints, and said mutually exclusive constraint groups such that a selection of said satisfied constraint in said each mutually exclusive constraint group is allowed to change;
   solving said mixed integer programming formulation to compute new values for said geometrical variables and said integer variables;
   extracting a modified integrated circuit layout from said new values of said geometrical variables; and
   storing said modified integrated circuit layout in a tangible computer accessible medium.

6. One or more processor readable storage devices as recited in claim 5 wherein the method further comprising constraints representing required relationships among said geometrical variables representing said geometrical components of the integrated circuit layout and said required relationships derived from design rules, electrical specifications, or user specifications among other requirements.

7. One or more processor readable storage devices as recited in claim 5 wherein the method further comprising constraints representing required relationships among said geometrical variables representing the geometrical components which are different in orientation.

8. One or more processor readable storage devices as recited in claim 5 wherein the method further comprising constraints representing required relationships among said geometrical variables representing said geometrical components of the integrated circuit layout with said required relationships have two or more non-overlapping ranges of allowable values.

9. A system performing a method for modifying an integrated circuit layout, the method comprising:
   receiving a plurality of geometrical components in the integrated circuit layout;
   allocating a plurality of geometrical variables to represent said geometrical components;
   constructing a plurality of constraints representing required relationships among said geometrical variables;
   constructing a plurality of mutually exclusive constraint groups with each mutually exclusive constraint group consisting of two or more of said constraints of which only one of said constraints can be satisfied while the remaining of said constraints must be unsatisfied;
   allocating a plurality of integer variables that can only take value of either 0 or 1 for each of said constraints in said mutually exclusive constraint groups;
   constructing a mixed integer programming formulation using said geometrical variables, said integer variables, said constraints, and said mutually exclusive constraint groups such that the selection of a said satisfied constraint in said each mutually exclusive constraint group is allowed to change;
   solving said mixed integer programming formulation to compute new values for said geometrical variables and said integer variables;
   extracting a modified integrated circuit layout from said new values of said geometrical variables; and
   storing said modified integrated circuit layout in a tangible computer accessible medium.

10. The system as recited in claim 9 wherein the method further comprising constraints representing required relationships among said geometrical variables representing said geometrical components of the integrated circuit layout and said required relationships derived from design rules, electrical specifications, or user specifications among other requirements.

11. The system as recited in claim 9 wherein the method further comprising constraints representing required relationships among said geometrical variables representing said geometrical components which are different in orientation.

12. The system as recited in claim 9 wherein the method further comprising constraints representing required relationships among said geometrical variables representing said geometrical components of the integrated circuit layout with said required relationships have two or more non-overlapping ranges of allowable values.

* * * * *